(12) United States Patent
Cheng (10) Patent No.: US 10,506,731 B2
(45) Date of Patent: Dec. 10, 2019

(54) DISPLAY ASSEMBLY, ELECTRONIC DEVICE AND METHOD FOR ASSEMBLING THE SAME

(71) Applicant: GUANGDONG OPPO MOBILE TELECOMMUNICATIONS CORP., LTD., Dongguan, Guangdong (CN)

(72) Inventor: Jiao Cheng, Guangdong (CN)

(73) Assignee: GUANGDONG OPPO MOBILE TELECOMMUNICATIONS CORP., LTD., Dongguan, Guangdong (CN)

(*) Notice: Subject to any disclaimer, the term of this patent is extended or adjusted under 35 U.S.C. 154(b) by 0 days.

(21) Appl. No.: 15/797,569

(22) Filed: Oct. 30, 2017

(65) Prior Publication Data

US 2018/0199457 A1 Jul. 12, 2018

(30) Foreign Application Priority Data

Jan. 9, 2017 (CN) .......................... 2017 1 0013762

(51) Int. Cl.
*H05K 5/03* (2006.01)
*G06F 1/16* (2006.01)
(Continued)

(52) U.S. Cl.
CPC ............. *H05K 5/03* (2013.01); *G06F 1/1637* (2013.01); *H01L 51/0097* (2013.01);
(Continued)

(58) Field of Classification Search
CPC ...... H05K 5/03; H05K 5/0017; H05K 5/0217; G06F 1/1637; H01L 51/0097; H01L 51/5237
See application file for complete search history.

(56) References Cited

U.S. PATENT DOCUMENTS

2010/0073583 A1 3/2010 Park et al.
2011/0067447 A1 3/2011 Zadesky et al.
(Continued)

FOREIGN PATENT DOCUMENTS

CN 204119285 U 1/2015
CN 104656804 A 5/2015
(Continued)

OTHER PUBLICATIONS

Notification of Office Action issued in corresponding Chinese application No. 201710013762.9, dated Mar. 4, 2019 (11 pages).
(Continued)

*Primary Examiner* — Hoa C Nguyen
*Assistant Examiner* — Keith DePew
(74) *Attorney, Agent, or Firm* — Ladas & Parry LLP (57) ABSTRACT

A display assembly is provided. The display panel may include a frame, a display panel, a cover plate, and an adhesive. The frame includes a bottom plate and a side wall. The display panel includes a top surface and a bottom surface, and the bottom surface of the display panel is attached on one surface of the bottom plate. The rear surface of the cover plate is attached to the top surface of the display panel. The side wall of the frame and the side surface of the cover plate may cooperatively define a gap. The adhesive is filled in the gap to bond the side surface of the cover plate to the side wall. An electronic device and a method for assembling the display assembly are also provided.

20 Claims, 10 Drawing Sheets

(51) Int. Cl.
　　　*H01L 51/00*　　(2006.01)
　　　*H01L 51/52*　　(2006.01)
　　　*H05K 5/00*　　(2006.01)
　　　*H05K 5/02*　　(2006.01)

(52) U.S. Cl.
　　　CPC ....... *H01L 51/5237* (2013.01); *H05K 5/0017* (2013.01); *H05K 5/0217* (2013.01)

(56) References Cited

U.S. PATENT DOCUMENTS

| | | | |
|---|---|---|---|
| 2013/0222298 | A1 | 8/2013 | Kato et al. |
| 2014/0177154 | A1* | 6/2014 | Lee ................. G06F 1/1656 361/679.26 |
| 2015/0253615 | A1* | 9/2015 | Ryu ................. G02F 1/133512 349/58 |
| 2016/0147260 | A1* | 5/2016 | Huang ............... G06F 1/1637 361/679.3 |

FOREIGN PATENT DOCUMENTS

| | | | | |
|---|---|---|---|---|
| CN | 104656804 | A | 5/2015 | ............... G06F 1/16 |
| CN | 104902035 | A | 9/2015 | |
| CN | 104902035 | A | 9/2015 | ............. H04M 1/02 |
| CN | 105116967 | A | 12/2015 | |
| CN | 105116967 | A | 12/2015 | ............... G06F 1/16 |
| CN | 105227715 | A | 1/2016 | |
| CN | 105282274 | A | 1/2016 | |
| CN | 105282274 | A | 1/2016 | ............. H04M 1/02 |
| CN | 204993512 | U | 1/2016 | |
| CN | 204993512 | U | 1/2016 | ............. H04M 1/02 |
| CN | 206332720 | U | 7/2017 | |
| CN | 206332720 | U | 7/2017 | ............. H04M 1/02 |

OTHER PUBLICATIONS

Examination Report issued in corresponding Indian application No. 2017114046120, dated Sep. 30, 2019 (7 pages).

* cited by examiner

DISPLAY ASSEMBLY, ELECTRONIC DEVICE AND METHOD FOR ASSEMBLING THE SAME

CROSS-REFERENCE TO RELATED APPLICATION

This application claims priority to a Chinese application No. 201710013762.9 filed on Jan. 9, 2017, titled "DISPLAY ASSEMBLY, ELECTRONIC DEVICE AND METHOD FOR ASSEMBLING THE SAME". The entirety of the above-mentioned applications is hereby incorporated by reference herein.

TECHNICAL FIELD

The present disclosure generally relates to electronic devices, and particularly to a display assembly, an electronic device including the display assembly and a method for assembling the display assembly.

BACKGROUND

As portable electronic devices, such as smart phones, become popular and a size of display panel of the smart phones grow larger, the smart phones can provide more functions and services (e.g., playing game, chatting, and reading) to satisfy requirements of users. A flexible screen attached with a cover plate has begun to be used as a display panel in the portable electronic device. However, when the portable electronic device falls on the ground, the flexible screen and the cover plate are easy delaminate, due to different stresses produced on the flexible screen and the cover plate.

SUMMARY

Embodiments of the present disclosure provide a display assembly. The display assembly may include a frame, a display panel, a cover plate, and an adhesive. The frame may include a bottom plate and a side wall extending from a periphery of the bottom plate. The display panel may include a top surface and a bottom surface, the bottom surface of the display panel being attached on one surface of the bottom plate. The cover plate may include a rear surface, a front surface and a side surface. The side surface is connected between the rear surface and the front surface. The rear surface of the cover plate may be attached to the top surface of the display panel. The display panel and the cover plate are surrounded by the side wall of the frame. The side wall of the frame and the side surface of the cover plate may cooperatively define a gap. The gap may have a width between the sidewall of the frame and the side surface of the cover plate. The width of the gap increases along a direction from the side surface toward the bottom plate. The adhesive is filled in the gap to bond the side surface of the cover plate to the side wall.

Embodiments of the present disclosure further provide an electronic device. The electronic device may include a display assembly and a back cover. The is mounted around a periphery of the display assembly. The display assembly may include a frame, a display panel, a cover plate, and an adhesive. The frame may include a bottom plate and a side wall extending from a periphery of the bottom plate. The display panel may be attached on the bottom plate. The portion of the cover plate near the front surface protrudes more outwardly than the portion of the cover plate near the rear surface with respect to a vertical line of the cover plate. The cover plate may include a rear surface, a front surface and a side surface. The side surface is connected between the rear surface and the front surface. The rear surface of the cover plate may be attached to the top surface of the display panel. The display panel and the cover plate are surrounded by the side wall of the frame. The adhesive is filled applied to bond the side surface of the cover plate to the side wall.

Embodiments of the present disclosure further provide a method for assembling a display assembly. The method may include: providing a cover plate comprising a bottom plate and a side wall extending from a periphery of the bottom plate; providing a display panel comprising a bottom surface, a top surface and a side surface connected between the bottom surface and the top surface; providing a cover plate comprising a rear surface, a front surface and a side surface, the side surface being connected between the rear surface and the front surface, wherein the portion of the cover plate near the front surface protrudes more outwardly than the portion of the cover plate near the rear surface with respect to a vertical line of the cover plate; attaching the cover plate to the top surface of the display panel; providing an adhesive; attaching the display panel to the bottom plate of the frame and bonding the side surface of the cover plate to the side wall by the adhesive.

BRIEF DESCRIPTION OF THE DRAWINGS

The accompanying drawings, which are incorporated in and constitute a part of this specification, illustrate exemplary embodiments of the present disclosure, and together with the description, explain the principles of the disclosure.

DETAILED DESCRIPTION OF ILLUSTRATED EMBODIMENTS

In order to make a better understanding of technical solutions of the present disclosure by those skilled in the art, the technical solutions of embodiments of the present disclosure will be described clearly and completely in combination with the accompanying drawings of the embodiments of the present disclosure. Obviously, the described embodiments are merely a part of embodiments of the present disclosure, and not all of the embodiments. All other embodiments acquired by those skilled in the art without creative efforts based on the embodiments of the present disclosure shall fall within the protection scope of the present disclosure.

In the description of the present disclosure, the orientation or positional relationship indicated by the terms "center", "up", "down", "front", "rear", "left", "right", "vertical", "horizontal", "top", "bottom", "inside", "outside", "inner", "outer" and the like, is based on the orientation or positional relationship illustrated in the drawings and merely for the purpose of facilitating the description of the present disclosure and simplifying description, rather than indicating or implying that the device or element referred to must have a specific orientation or constructed and operated in a particular orientation, and therefore, should not be construed as limiting the present disclosure.

Terms "first", "second" and so on used in the specification, appended claims, and accompanying drawings of the present disclosure are used to distinguish different objects rather than describe specific sequences. The terms "a number of" or "multiple" means two or more than two.

In the description of the present disclosure, it is to be understood that the terms "install", "connect", "couple" should be broadly understood, unless otherwise specified and defined. For example, a connection may be a fixed connection or a removable connection, or an integrally connection. A connection also can be a directly connection or an indirectly connection by intermediate medium. The specific meaning of the above-mentioned terms in the present disclosure may be understood by those skilled in the art considering specific circumstances.

Additionally, terms "include", "have", and any deformation thereof are intended to cover non-exclusive inclusion relationship. For example, a process, method, system, product, or device including a series of operations or units is not limited to listed operations or units, and In at least one alternative embodiment, can include operations or units which are not listed, or in at least one alternative embodiment, can further include other inherent operations or units for the process, method, product, or device.

The "embodiments" mentioned herein means that features, structures or features described with reference to the embodiments may be included in at least one embodiment of the disclosure. Phrases appearing at various positions of the specification neither always refer to the same embodiment, nor separate or alternative embodiments that are mutually exclusive with other embodiments. It is explicitly and implicitly understood by those skilled in the art that the embodiments described herein may be combined with other embodiments.

Embodiments of the present disclosure provide a display assembly, an electronic device, and a method for assembly the display assembly.

The electronic devices may be portable electronic devices including, but not limited to, such as cellular telephones, media players, handheld computers (also sometimes called personal digital assistants), wearable smart watches and handheld gaming devices.

Figure 1:
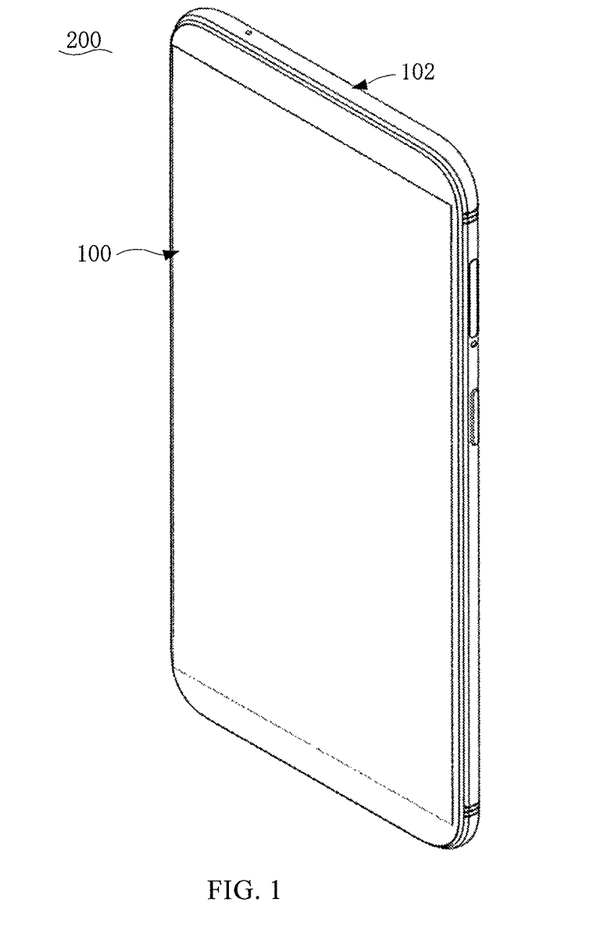
FIG. 1 is a schematic view of an electronic device in accordance with an embodiment of the present disclosure.

An illustrative electronic device in accordance with an embodiment of the present disclosure is shown in FIG. 1. The electronic device illustrated in FIG. 1 may be, for example, a handheld electronic device that supports 2G, 3G or 4G cellular telephone and data functions, global positioning system capabilities or other satellite navigation capabilities. 2G refers to second generation of broadband cellular network technology, 3G refers to third generation and 4G refers to fourth generation. The electronic device may also be a handheld electronic device that supports local wireless communications capabilities (e.g., IEEE 802.11 and Bluetooth®) and that supports handheld computing device functions such as internet browsing, email and calendar functions, games, media player functionality, etc.

The following will specifically illustrate various embodiments respectively.

Figure 2:
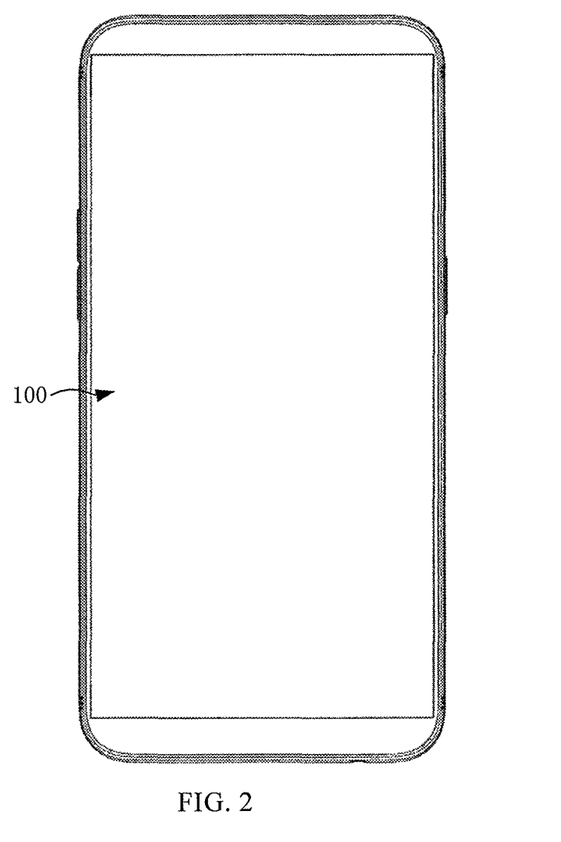
FIG. 2 is a front view of an electronic device in accordance with an embodiment of the present disclosure.

FIG. 1 is a schematic view showing an electronic device in accordance with an embodiment of the present disclosure. FIG. 2 is a schematic plan view of the electronic device in FIG. 1.

As illustrated in FIG. 1 and FIG. 2, the electronic device 200 may include a display assembly 100 and a back cover 102 mounted around the periphery of the display assembly 100.

The display assembly 100 is configured to display information such as images, texts, videos and the like. The back cover 102 is configured to protect electronic components mounted in the electronic device 200, such as batteries, circuit boards, etc. The back cover 102 may be made of a material of plastic (i.e. polycarbonate), glass (i.e. aluminosilicate glass), or metal (i.e. stainless steel).

Figure 3:
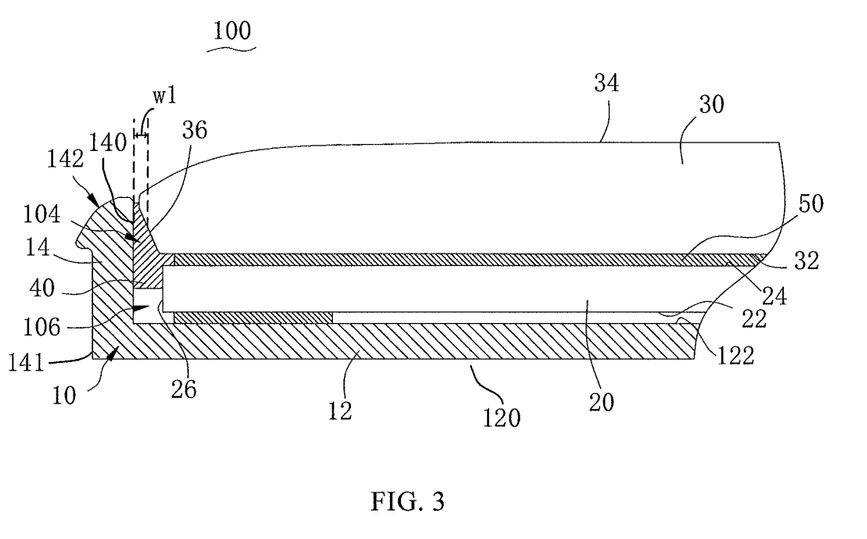
FIG. 3 is a schematic cross-sectional view of a display assembly of the electronic device in accordance with an embodiment of the present disclosure.

As illustrated in FIG. 3, the display assembly 100 may include a frame 10, a display panel 20, a cover plate 30 and an adhesive 40.

The frame 10 is configured to support the display panel 20 and the cover plate 30. The lamination of the display panel 20 and the cover plate 30 is mounted on the frame 10. The frame 10 may include a bottom plate 12 and a side wall 14 extending from a periphery of the bottom plate 12 in a direction substantially perpendicular to the bottom plate 12. The bottom plate 12 and the side wall 14 cooperatively define a space to accommodate the display panel 20 and the cover plate 30.

In some embodiment, the bottom plate 12 may be a rectangular base and includes a bottom surface 120 and a top surface 122 opposite to the bottom surface 120. The side wall 14 may include an inner surface 140, an outer surface 141 and a rim surface 142 connected between the inner surface 140 and the outer surface 141. The rim surface 142 is an end surface of the side wall 14 exposed to the outside. In some embodiment, the inner surface 140 of the side wall 14 is substantially perpendicular to the top surface 122 of the bottom plate 12.

The frame 10 may be provided by injection molding within a mold. The rim surface 142 is exposed outside the electronic device 200, and the other portion of the frame 10 other than the rim surface 142 of the side wall 14 is a bracket that can be used in the electronic device 200 to support the display panel 20 and the cover plate 30. Thus, the rim surface 142 of the side wall 14 can be used as the decorative ring of the electronic device 200, and the decorative ring and the bracket can be joined together by means of an injection molding in a mold to form the frame 10.

The frame 10 may be made of metallic material such as steel, aluminum alloy, magnesium alloy. In alternative embodiment, the frame 10 may be made of other suitable material, such as acrylonitrile-butadiene-styrene copolymer (ABS), polyvinyl chloride (PVC) and Polycarbonate (PC). The material of the frame 10 is not limited to the above materials, and suitable materials may be selected according to the demand in practical application. The rim surface 142 can be passed over a glossy metal layer, such as a chrome layer, so that the electronic device 200 is made more beautiful.

As illustrated in FIG. 3, the display panel 20 may include a bottom surface 22, a top surface 24 and a side surface 26 connected between the bottom surface 22 and the top surface 24. The bottom surface 22 of the display panel 20 is attached to the top surface 122 of the bottom plate 12. For example, the bottom surface 22 of the display panel 20 can be attached to the top surface 122 by dispensing.

In the exemplary embodiments of the present disclosure, the display panel 20 may be any flexible display panel. The display panel 20 may include a flexible display based on organic light-emitting diode (OLED) technology and its variants, and a flexible display based on E-paper technology.

Figure 4:
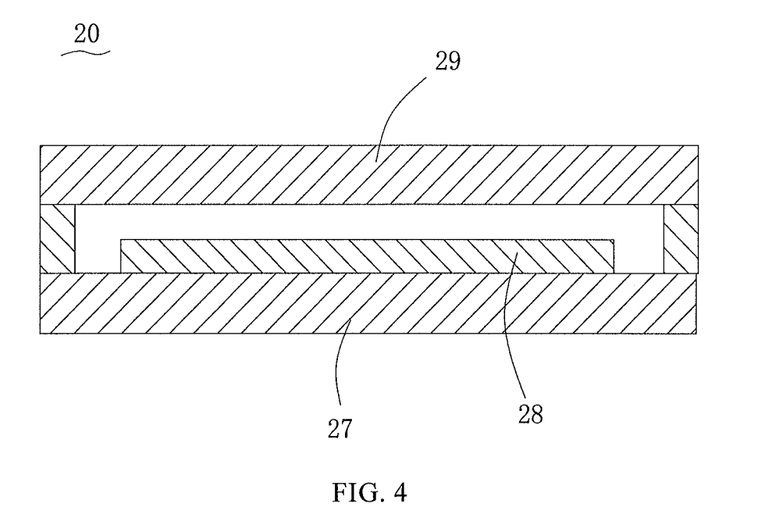
FIG. 4 is a schematic cross-sectional view of a display panel of the display assembly in accordance with an embodiment of the present disclosure.

As an example, FIG. 4 shows a schematic cross-sectional view of a flexible OLED display panel 20. As illustrated in FIG. 4, the display panel 20 may include a substrate layer 27, a light emitting layer 28 and an encapsulation layer 29. The light emitting layer 28 is disposed on the substrate layer 27. The encapsulation layer 29 covers the light emitting layer 28 to prevent the light emitting layer 28 from contacting with the air. The light emitting layer 28 is configured to generate lights to make display panel 20 display information.

The flexible OLED display can work without a backlight, thus, it can display greater contrast ratio and wider viewing angle and can be thinner and lighter than a liquid crystal display (LCD). The flexible OLED display also has a much faster response time than the LCD. In addition, the flexible OLED display is cheaper to produce. Therefore, using the flexible OLED display as the display panel 20, the thickness and cost of the electronic device 200 can be reduced, and the expression of the electronic device 200 can be improved.

As illustrated in FIG. 3, the cover plate 30 may include a rear surface 32, a front surface 34 and a side surface 36 connected between the rear surface 32 and the front surface 34. In some embodiment, the portion of the cover plate 34 near the front surface 34 protrudes more outwardly than the portion of the cover plate 34 near the rear surface 32, with respect to a vertical line of the cover plate 34.

The cover plate 30 is attached to the top surface 24 of the display panel 20. In some embodiment, the rear surface 32 of the cover plate 30 is fully laminated touched with the top surface 24 of the display panel 20. As an example, the rear surface 32 of the cover plate 30 may be attached to the top surface 24 of the display panel 20 by an optically clear adhesive (OCA) 15. In at least one alternative embodiment, the rear surface 32 of the cover plate 30 may be attached to the top surface 24 of the display panel 20 only at the border of the top surface 24.

In some embodiment, the cover plate 30 may be a touch panel cover, that is, touch lines may be integrated in the cover plate 30. Therefore, the user may perform a gesture operation on the front surface 34 of the cover plate 30, such as clicking, pressing or sliding, to control the electronic device 200 to perform the corresponding functions.

For example, the cover plate 30 may include a touch panel and a protective panel provided on the touch panel. The touch panel is configured to realize the touch operation of the display assembly, and the protective panel is configured to protect the touch panel to avoid touching the touch panel directly, which may cause damage to the touch panel.

The cover plate 30 may be made of a light-transmitting material such as glass, ceramic, sapphire, polyvinyl chloride (PVC) or the like. Since the cover plate 30 is an external component of the electronic device 200, it will be hit or scraped. For example, when the user puts the electronic device 200 into a pocket, the cover plate 30 may be damaged by the key in the pocket. Or when the user performs a gesture operation by fingers on the cover plate 30, the cover plate 30 may be scraped by nails. Thus, the cover plate 30 may be made of a material having a relatively high hardness, such as the sapphire material described above. In some embodiment, a protective plate may be provided one the front surface 34 of the cover plate 30 to prevent the cover plate 30 from being scratched.

The laminated structure of the display panel 20 and the cover plate 30 is surrounded by the side wall 14 of the frame 10. The side wall 14 of the frame 10 and the side surface 36 of the cover plate 30 are cooperatively define a first gap 104. The first gap 104 has a width w1 between the side wall 14 of the frame 10 and the side surface 36 of the cover plate 30. In the illustrated embodiments, the width w1 of the first gap 104 increases along a direction from the side surface 36 toward the bottom plate 12. The minimum width of the first gap 104 is, for example, 0.05 mm. The side surface 36 may be a plane surface or a curved surface.

The side surface 26 of the display panel 20 and the side wall 14 of the frame 10 may cooperatively define a second gap 106. The second gap 106 is communicated with the first gap 104. The width of the second gap 106 is in the range of from approximately 0.15 mm to approximately 0.2 mm. For example, the width of the second gap 106 may be 0.15 mm, 0.16 mm, 0.17 mm, 0.18 mm, 0.19 mm, or 0.2 mm.

The adhesive 40 may be advanced epoxy, silicone, cyanoacrylate and UV cure adhesive.

As illustrated in FIG. 3, the adhesive 40 is applied in the first gap 104 bounding the side surface 36 of the cover plate 30 to the inner surface 140 of the side wall 14. In some embodiment, the first gap 104 may be fully filled by the adhesive 40. In at least one of alternative embodiment, the first gap 104 may be partially filled by the adhesive 40. The adhesive 40 may also be applied in the second gap 106 bounding the side surface 26 of the display panel 20 and side wall 14 of the frame 10. As illustrated in FIG. 3, the adhesive 40 may only fill part of the second gap 106. In at least one of alternative embodiment, the adhesive 40 may fill the first gap 104 completely.

In some embodiment, when the display assembly 100 is assembled, the display panel 20 is bound to the cover plate 30 by the optically clear adhesive (OCA) 32, and then the adhesive 40 is applied in the first gap 104 defined by the side surface 36 of the cover plate 30 to the inner surface 140 of the side wall 14. Since the first gap 104 is communicated with the second gap 106, a part of the adhesive 40 may be applied in the second gap 106 to bond the side surface 26 of the display panel 20 to the side wall 14 of the frame 10. The adhesive 40 may also be applied in the gap between the display panel 20 and the cover plate 30 to stick the side surface 26 of the display panel 20 and the side surface 36 of the cover plate 30 to the side wall 14.

In at least one alternative embodiment, when the display assembly 100 is assembled, the display panel 20 is bound to the cover plate 30 by the optically clear adhesive (OCA) 32, and then the side surface 26 of the display panel 20 and the side surface 36 of the cover plate 30 may be coated with a layer of the adhesive 40. The side surface 26 of the display panel 20 and the side surface 36 of the cover plate 30 both coated with the adhesive 40 are secured to the inner surface 140 of the side wall 14. The bottom surface 22 of the display panel 20 is attached to the top surface 122 of the bottom plate 12.

In some embodiment, the side surface 26 of the display panel 20 may be directly attached to inner surface 140 of the side wall 14.

Figure 5:
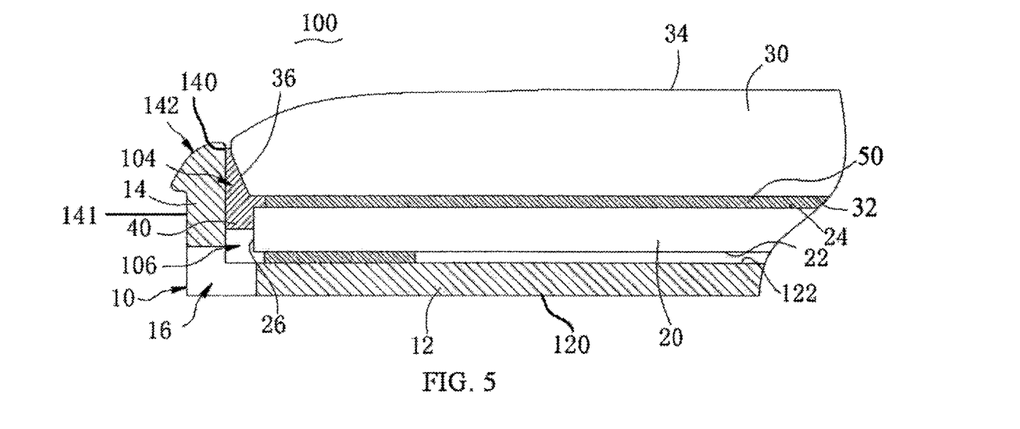
FIG. 5 is a schematic cross-sectional view of a display assembly in accordance with another embodiment of the present disclosure.

FIG. 5 is a schematic cross-sectional view of a display assembly of the electronic device in accordance with another embodiment of the present disclosure.

As illustrated in FIG. 5, to facilitate dispensing, the frame 10 may define at least one through hole 16 to communicate the inside and outside of the frame 10.

Figure 6:
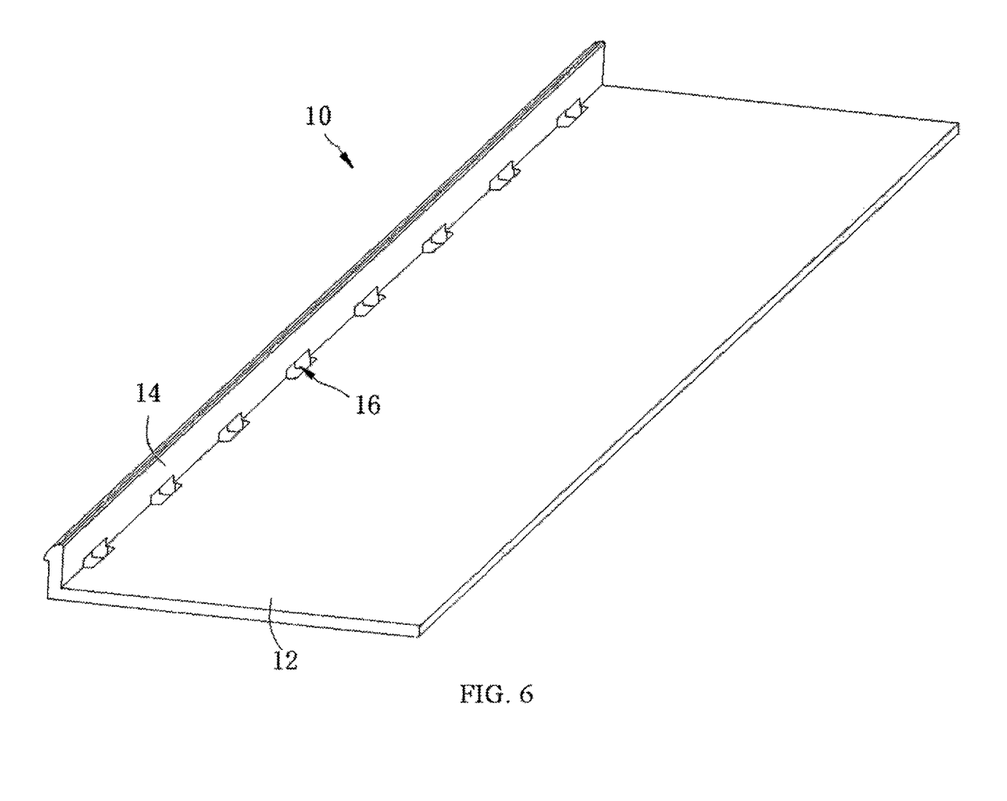
FIG. 6 is a schematic view of the frame in accordance with the embodiment of the present disclosure illustrated in FIG. 5.

In some embodiment, as illustrate in FIG. 6, the frame 10 may define a plurality of through holes 16. The plurality of through holes 16 may be spaced apart with each other along a junction line of the bottom plate 12 and the side wall 14. The plurality of through holes 16 may be equally spaced from each other. In at least one alternative embodiment, the distance between some adjacent through holes 16 is different from that of other adjacent through holes 16.

In alternative embodiments, the at least one through hole 16 may be defined in the bottom plate 12 or the side wall 14.

In some embodiment, when the display assembly 100 is assembled, the display panel 20 is bound to the cover plate 30 by the optically clear adhesive (OCA) 32, and then the cover plate 30 and the display panel 20 is disposed on the top surface 122 of the bottom plate 12. The adhesive 40 is applied into the first gap 104 and the second gap 106 via the through hole 16, for bonding the side surface 26 of the display panel 20 and the side surface 36 of the cover plate 30 to the side wall 14.

Figure 7:
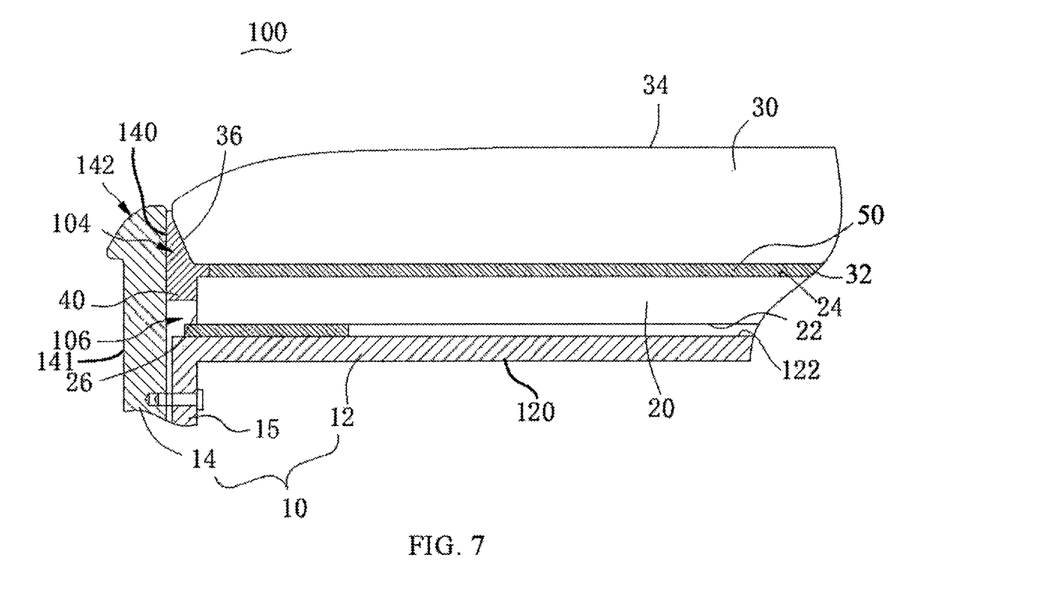
FIG. 7 is a schematic cross-sectional view of a display assembly in accordance with further another embodiment of the present disclosure.

FIG. 7 is a schematic cross-sectional view of a display assembly of the electronic device in accordance with further another embodiment of the present disclosure.

As illustrated in FIG. 7, the frame 10 may further include a connection wall 15 extends from the edges of the bottom plate 12 upwardly or downwardly in a direction substantially perpendicular to bottom plate 12. In the illustrated embodiment in FIG. 5, the connection wall 15 extends from the edges of the bottom plate 12 far away from the cover plate 30. The connection wall 15 and the bottom plate 12 may all integrally molded of plastic materials.

The connection wall 15 may be secured to the side wall 14 by a gluing, a threaded connection, an engagement, a welding method, or a combination thereof. For example, as illustrated in FIG. 7, the connection wall 15 may define a through hole therein, and the side wall 14 may define a threaded hole in the inner surface 140, at a position corresponding to the through hole 150 in the connection wall 15. The side wall 14 and the connection wall 15 is fastened by a screw being inserted through the through hole 150 and screwed into the threaded hole 144. The connection wall 15 may extend from the edges of the bottom surface 120 in a direction toward the cover plate 30. The connection wall 15 may secured to the said wall 14 by dispensing.

Figure 8:
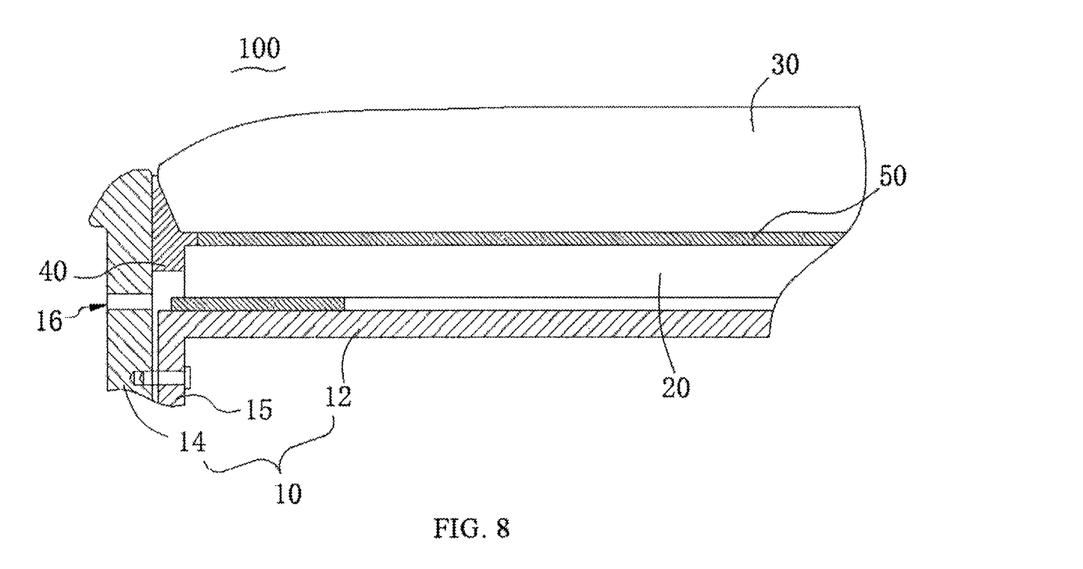
FIG. 8 is a schematic cross-sectional view of a display assembly including a through hole in accordance with further another embodiment of the present disclosure.

In at least one alternative embodiment, as illustrated in FIG. 8, the through hole 16 for facilitating dispensing may be defined in the side wall 14 at a position corresponding to the first gap 104 or the second gap 106.

In the embodiments of the present disclosure, the side surface 36 of the cover plate 30 is bonded to the side wall 14 by the adhesive 40. When the electronic apparatus 200 is dropped, the stress of the cover plate 30 is at least partially absorbed by the side wall 14, which can prevent the cover plate 30 from pulling the display panel 20 off and improve the anti-drop performance and life of the electronic device 200. In addition, the border of the display assembly 100 can be narrower while the stability of the display assembly 100 is enhanced by bonding the side surface of the cover plate 30 and to the side wall 14. Thus, the display pane assembly 100 can show more information at the electronic device's display area.

Figure 9:
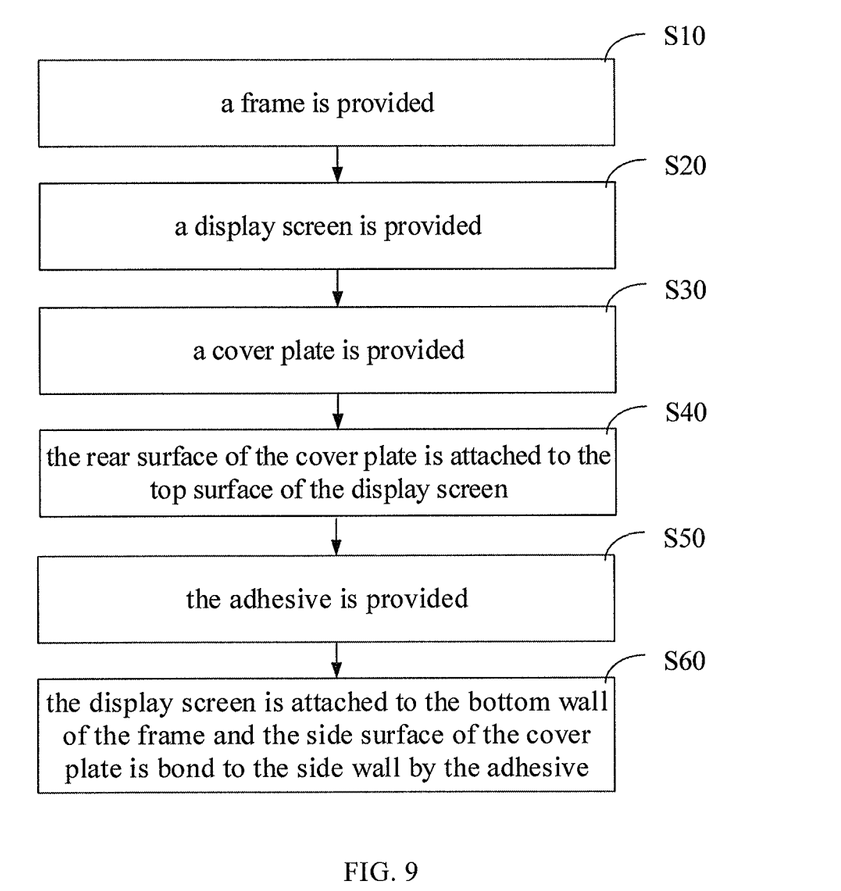
FIG. 9 is a flow chart showing a method for assembling the display assembly in accordance with an embodiment of the present disclosure.
Figure 10:
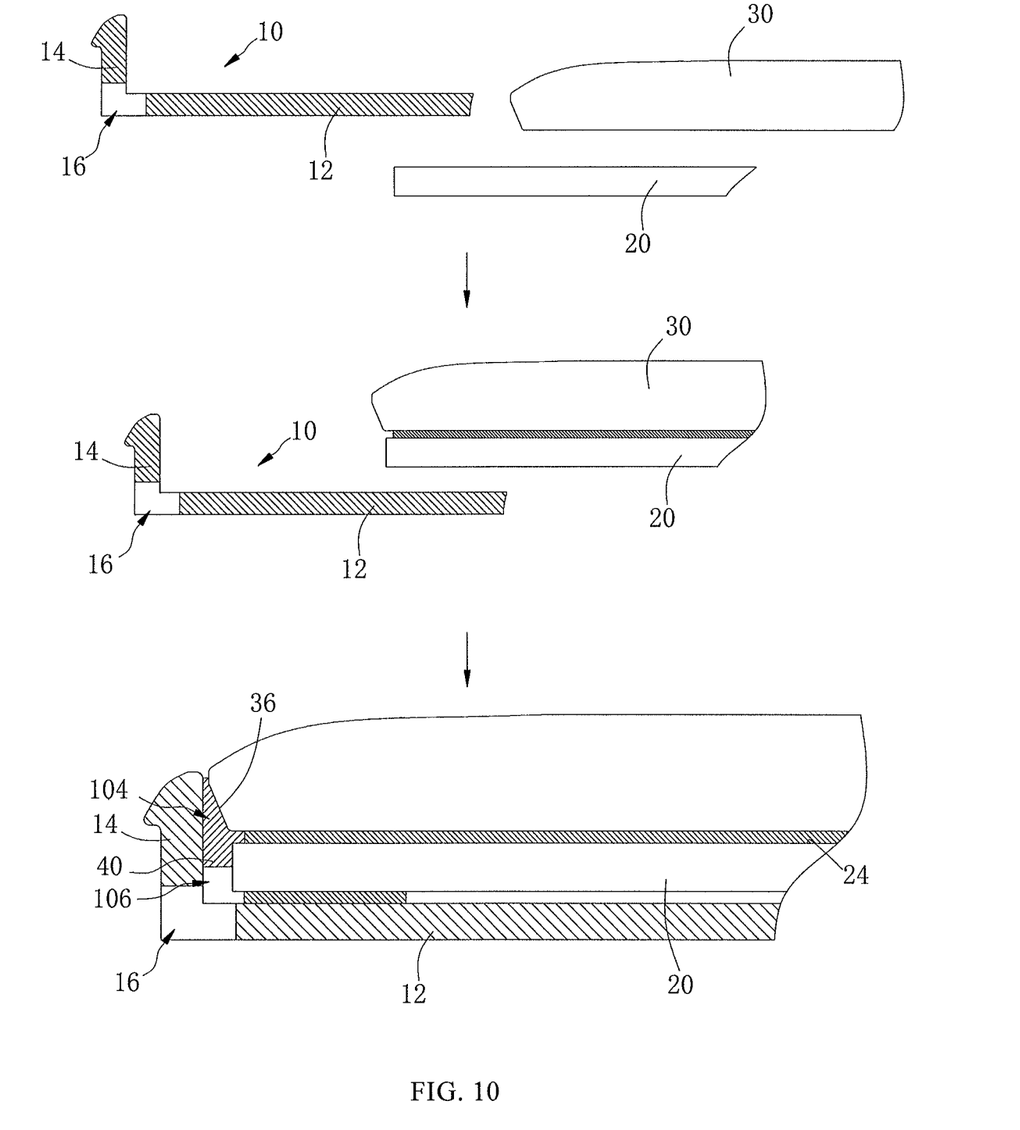
FIG. 10 is a diagram of assembling process of the display assembly in accordance with an embodiment of the present disclosure.

FIG. 9 is a flow chart showing a method for assembling the display assembly in accordance with an embodiment of the present disclosure. FIG. 10 is a diagram of assembling process of the display assembly in accordance with an embodiment of the present disclosure. Referring to FIG. 9 and FIG. 10, the method for assembling the display assembly may include follows.

In block S10, a frame 10 is provided, wherein the frame 10 includes a bottom plate 12 and a side wall 14 extends from the periphery of the bottom plate 12.

In some embodiment, the side wall 14 is substantially perpendicular to the bottom plate 12. The bottom plate 12 and the side wall 14 cooperatively define a space to accommodate the display panel 20 and the cover plate 30. The frame 10 may be provided by injection molding within a mold. The bottom plate 12 and the side wall 14 may also be individually molded and assembled. In some embodiment, the frame 10 may define a through hole 16 in the side wall 14, bottom plate 12, or the junction between the side wall 14 and the bottom plate 12.

In block S20, a display panel 20 is provided, wherein the display panel 20 includes a bottom surface 22, a top surface 24 and a side surface 26 connected between the bottom surface 22 and the top surface 24. The display panel 20 may be any flexible display panel.

In block S30, a cover plate 30 is provided, wherein the cover plate 30 includes a rear surface 32, a front surface 34 and a side surface 36 connected between the rear surface 32 and the front surface 34. The front portion at the side of the front surface 34 of the cover plate 34 protrudes more outwardly than the rear portion at the side of the rear surface 32 of the cover plate 34, with respect to a vertical line of the cover plate 34. The cover plate 30 can obtained by cutting a substrate to appropriate size and shape.

In block S40, the rear surface 32 of the cover plate 30 is attached to the top surface 24 of the display panel 20. As an example, the rear surface 32 of the cover plate 30 may be attached to the top surface 24 of the display panel 20 by an optically clear adhesive (OCA) 15.

In block S50, the adhesive 40 is provided. The adhesive 40 may be advanced epoxy, silicone, cyanoacrylate and UV cure adhesive.

In block S60, the display panel 20 is attached to the bottom plate 12 of the frame 10 and the side surface 36 of the cover plate 30 is bond to the side wall by the adhesive 40. The side wall 14 of the frame 10 and the side surface 36 of the cover plate 30 are cooperatively define a first gap 104. The first gap 104 has a width w1 between the side wall 14 of the frame 10 and the side surface 36 of the cover plate 30. In the illustrated embodiments, the width w1 of the first gap 104 increases along a direction from the side surface 36 toward the bottom plate 12. The adhesive 40 is applied in the first gap 104 bounding the side surface 36 of the cover plate 30 to the inner surface 140 of the side wall 14. In some embodiment, the first gap 104 may be fully filled by the adhesive 40. In at least one of alternative embodiment, the first gap 104 may be partially filled by the adhesive 40.

Figure 11:
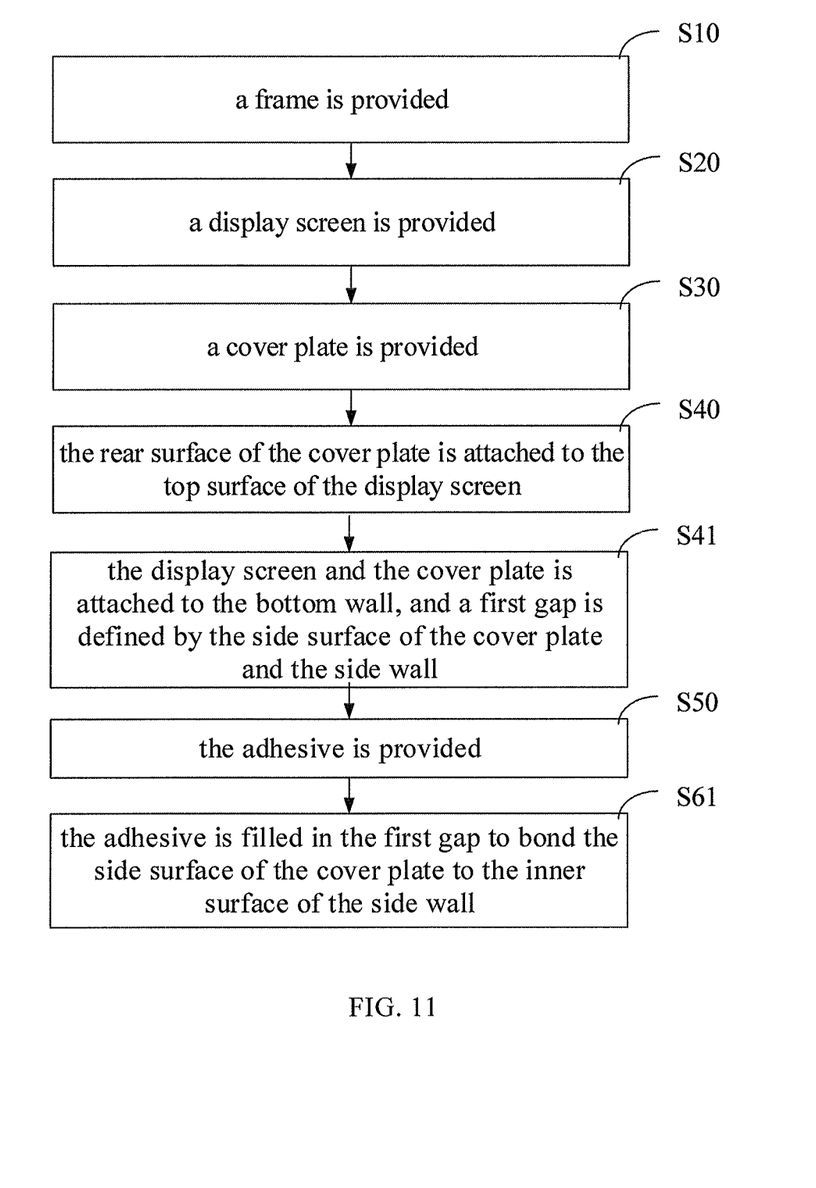
FIG. 11 is a flow chart showing a method for assembling the display assembly in accordance with another embodiment of the present disclosure.

FIG. 11 is a flow chart showing a method for assembling the display assembly in accordance with another embodiment of the present disclosure. In the exemplary embodiment as illustrated in FIG. 11, the method for assembling the display assembly may include follows.

In block S10, a frame 10 is provided, wherein the frame 10 includes a bottom plate 12 and a side wall 14 extends from the periphery of the bottom plate 12.

In block S20, a display panel 20 is provided, wherein the display panel 20 includes a bottom surface 22, a top surface 24 and a side surface 26 connected between the bottom surface 22 and the top surface 24. The display panel 20 may be any flexible display panel.

In block S30, a cover plate 30 is provided, wherein the cover plate 30 includes a rear surface 32, a front surface 34 and a side surface 36 connected between the rear surface 32 and the front surface 34.

In block S40, the rear surface 32 of the cover plate 30 is attached to the top surface 24 of the display panel 20.

In block S41, the display panel 20 and the cover plate 30 is attached to the bottom plate 12, and a first gap is defined by the side surface 36 of the cover plate 30 and the side wall 14 cooperatively.

In block S50, the adhesive 40 is provided.

In block S61, the adhesive 40 is filled in the first gap 104 to bond the side surface 36 of the cover plate 30 to the inner surface 140 of the side wall 14. The adhesive 40 may be filled into the first gap 104 through the opening above the first gap 104.

Figure 12:
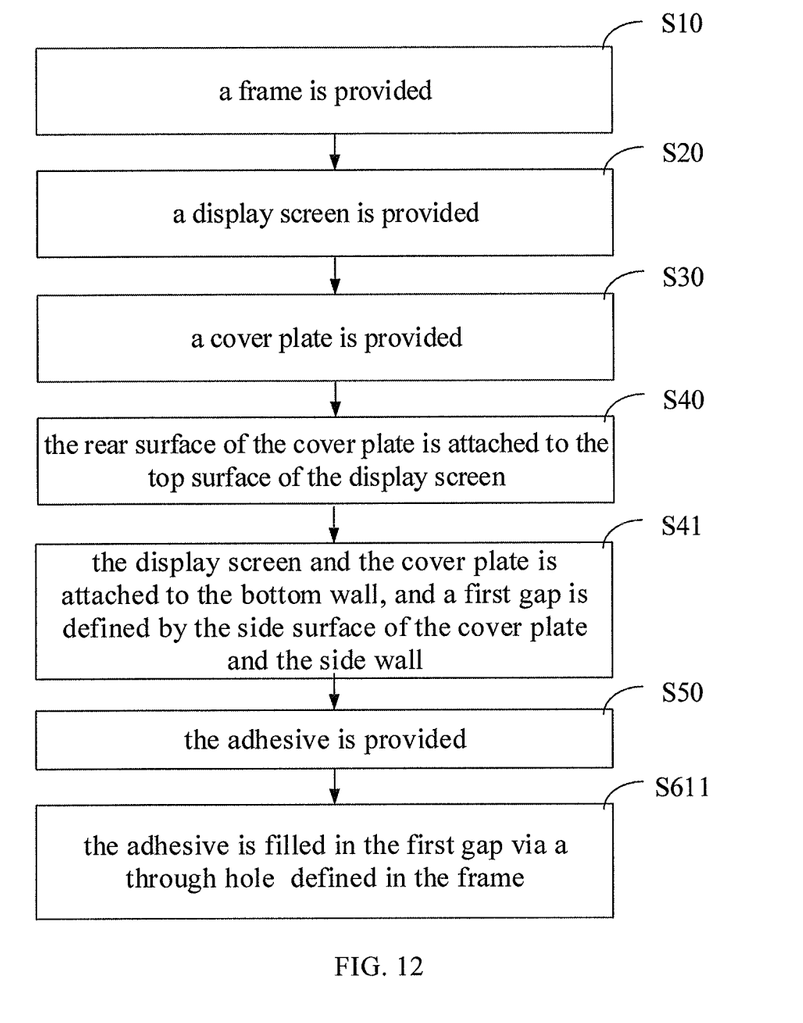
FIG. 12 is a flow chart showing a method for assembling the display assembly in accordance with further another embodiment of the present disclosure.

Is illustrated in FIG. 12, the block S61 may also be the block S611.

In block S611, the adhesive 40 is filled in the first gap 104 via a through hole 16 defined in the frame 10. The side surface 26 of the display panel 20 and the side wall 14 of the frame 10 may cooperatively define a second gap 106. The second gap 106 is communicated with the first gap 104 and the through hole 16. The adhesive 40 is filled in the second gap 106 via a through hole 16 defined in the frame 10 firstly, and then the adhesive 40 is filled in the first gap 104.

Figure 13:
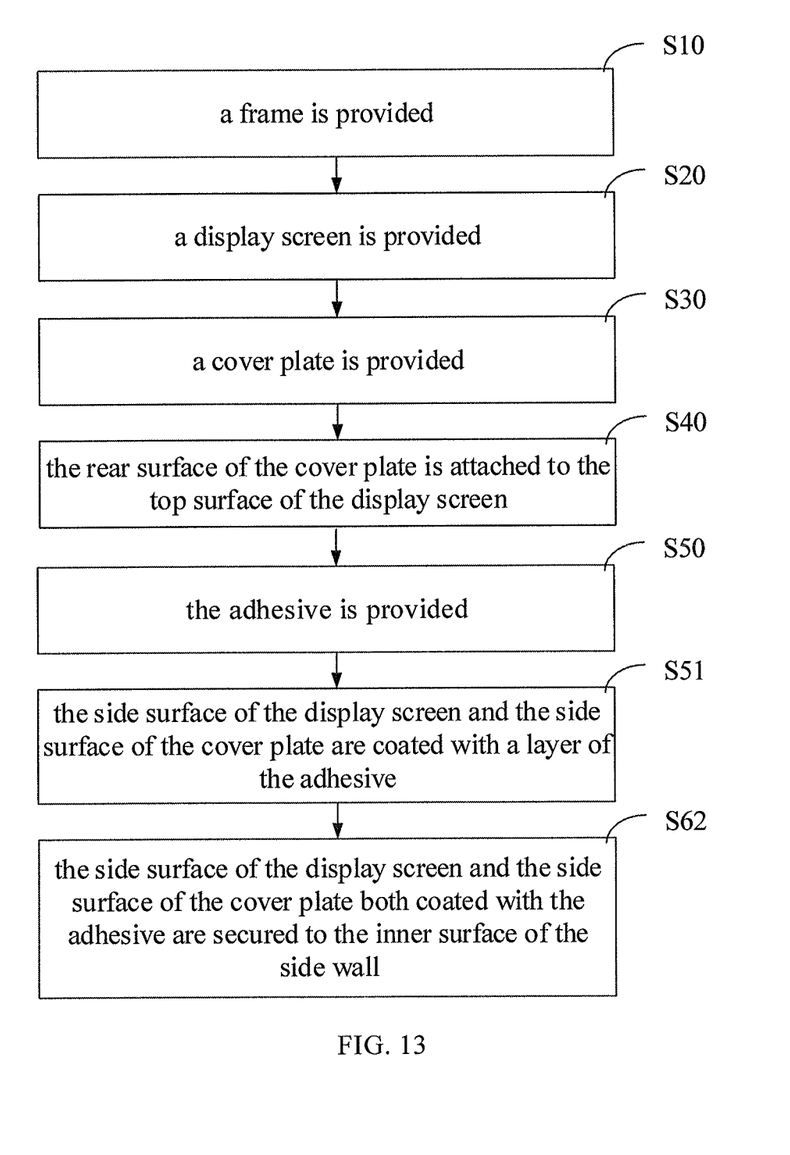
FIG. 13 is a flow chart showing a method for assembling the display assembly in accordance with an additional embodiment of the present disclosure.

FIG. 13 is a flow chart showing a method for assembling the display assembly in accordance with another embodiment of the present disclosure. In the exemplary embodiment as illustrated in FIG. 13, the method for assembling the display assembly may include follows.

In block S10, a frame 10 is provided, wherein the frame 10 includes a bottom plate 12 and a side wall 14 extends from the periphery of the bottom plate 12.

In block S20, a display panel 20 is provided, wherein the display panel 20 includes a bottom surface 22, a top surface 24 and a side surface 26 connected between the bottom surface 22 and the top surface 24. The display panel 20 may be any flexible display panel.

In block S30, a cover plate 30 is provided, wherein the cover plate 30 includes a rear surface 32, a front surface 34 and a side surface 36 connected between the rear surface 32 and the front surface 34.

In block S40, the rear surface 32 of the cover plate 30 is attached to the top surface 24 of the display panel 20.

In block S50, the adhesive 40 is provided.

In block S51, the side surface 26 of the display panel 20 and the side surface 36 of the cover plate 30 are coated with a layer of the adhesive 40.

In block S62, the side surface 26 of the display panel 20 and the side surface 36 of the cover plate 30 both coated with the adhesive 40 are secured to the inner surface 140 of the side wall 14.

In the embodiments of the present disclosure, the side surface 36 of the cover plate 30 is bonded to the side wall 14 by the adhesive 40. When the electronic apparatus 200 is dropped, the stress of the cover plate 30 is at least partially absorbed by the side wall 14, which can prevent the cover plate 30 from pulling the display panel 20 off and improve the anti-drop performance and life of the electronic device 200. In addition, the border of the display assembly 100 can be narrower while the stability of the display assembly 100 is enhanced by bonding the side surface of the cover plate 30 and to the side wall 14. Thus, the display pane assembly 100 can show more information at the electronic device's display area.

While the present disclosure has been described in terms of what is presently considered to be the most practical and preferred embodiments, it is to be understood that the present disclosure needs not be limited to the disclosed embodiment. On the contrary, it is intended to cover various modifications and similar arrangements included within the spirit and scope of the appended claims which are to be accorded with the broadest interpretation to encompass all such modifications and similar structures.

What is claimed is:

1. A display assembly, comprising:
    a frame comprising a bottom plate and a side wall extending from a periphery of the bottom plate;
    a display panel comprising a top surface and a bottom surface, the bottom surface of the display panel being attached on one surface of the bottom plate;
    a cover plate comprising a rear surface, a front surface and a side surface, the side surface being connected between the rear surface and the front surface, the rear surface of the cover plate being attached to the top surface of the display panel, the display panel and the cover plate being surrounded by the side wall of the frame, the side wall of the frame and the side surface of the cover plate cooperatively defining a gap, the gap having a width between the side wall of the frame and the side surface of the cover plate, wherein the width of the gap increases along a direction from the side surface toward the bottom plate; and
    an adhesive being filled in the gap to bond the side surface of the cover plate to the side walk;
    wherein the side surface of the display panel and the side wall of the frame cooperatively define another gap, the another gap is communicated with the gap between the side wall of the frame and the side surface of the cover plate, and the adhesive is filled in the another gap to bond the side surface of the display panel to the side wall.

2. The display assembly as claimed in claim 1, wherein the frame defines at least one through hole therein, the through hole is communicated with the gap or the another gap.

3. The display assembly as claimed in claim 2, wherein the through hole is defined in the side wall, the bottom plate or a junction between the side wall and the bottom plate.

4. The display assembly as claimed in claim 2, wherein the frame defines a plurality of through holes, the plurality of through holes is spaced apart with each other along a junction line of the bottom plate and the side wall.

5. The display assembly as claimed in claim 1, wherein the another gap is in the range of from 0.15 mm to 0.2 mm.

6. The display assembly as claimed in claim 1, wherein the frame further comprises a connection wall extending from a periphery of the bottom plate.

7. The display assembly as claimed in claim 6, wherein the connection wall is secured to the side wall of the bottom frame by any one or a combination of one of a gluing, a threaded connection, an engagement, and a welding method.

8. The display assembly as claimed in claim 6, wherein the connection wall is perpendicular to the bottom plate.

9. The display assembly as claimed in claim 1, wherein the display panel is a flexible screen.

10. The display assembly as claimed in claim 1, wherein the cover plate is a touch panel cover.

11. The display assembly as claimed in claim 1, wherein the side surface of the cover plate comprises a plane surface or a curved surface.

12. The display assembly as claimed in claim 1, wherein a minimum width of the gap is 0.05 mm.

13. The display assembly as claimed in claim 1, wherein the rear surface of the cover plate touches the top surface of the display panel fully.

14. The display assembly as claimed in claim 1, wherein the rear surface of the cover plate is attached to the top surface of the display panel by an optically clear adhesive.

15. An electronic device, comprising:
a display assembly comprising:
    a frame comprising a bottom plate and a side wall extending from a periphery of the bottom plate;
    a display panel being attached on the bottom plate;
    a cover plate comprising a rear surface, a front surface and a side surface, the side surface being connected between the rear surface and the front surface, the rear surface of the cover plate being attached to the display panel, the portion of the cover plate near the front surface protruding more outwardly than the portion of the cover plate near the rear surface with respect to a vertical line of the cover plate, the display panel and the cover plate being surrounded by the side wall of the frame, the side wall of the frame and the side surface of the cover plate cooperatively defining a gap;
    an adhesive being applied to bond the side surface of the cover plate to the side wall; and
    the side surface of the display panel and the side wall of the frame cooperatively defining another gap, the another gap being communicated with the gap between the side wall of the frame and the side surface of the cover plate, and the adhesive being filled in the another gap to bond the side surface of the display panel to the side wall; and
a back cover being mounted around a periphery of the display assembly.

16. The electronic device as claimed in claim 15, wherein the frame defines at least one through hole therein, the through hole being communicated with the gap or the another gap.

17. The electronic device as claimed in claim 16, wherein the through hole is defined in the side wall, the bottom plate, or a junction between the side wall and the bottom plate.

18. A method for assembling a display assembly, comprising:
    providing a frame comprising a bottom plate and a side wall extending from a periphery of the bottom plate;
    providing a display panel comprising a bottom surface, a top surface and a side surface connected between the bottom surface and the top surface;
    providing a cover plate comprising a rear surface, a front surface and a side surface, the side surface being connected between the rear surface and the front surface, wherein the portion of the cover plate near the front surface protrudes more outwardly than the portion of the cover plate near the rear surface with respect to a vertical line of the cover plate;
    attaching the cover plate to the top surface of the display panel;
    providing an adhesive;
    attaching the display panel to the bottom plate of the frame to form a gap defined by the side surface of the cover plate to the side wall, wherein the side surface of the display panel and the side wall of the frame cooperatively define another gap, the another gap being communicated with the gap;
    filling the adhesive in the gap to bond the side surface of the cover plate to the inner surface of the side wall.

19. The method as claimed in claim 18, wherein a through hole defined in the frame, the filling the adhesive in the gap to bond the side surface of the cover plate to the inner surface of the side wall comprises:
    filling the adhesive in the gap via the through hole and the another gap successively to bond the side surface of the cover plate to the side wall.

20. The method as claimed in claim 18, wherein attaching the display panel to the bottom plate of the frame and bonding the side surface of the cover plate to the side wall by the adhesive comprises:
    coating a layer of the adhesive on the side surface of the display panel and the side surface of the cover plate;
    securing the side surface of the display panel and the side surface of the cover plate both coated with the adhesive to the side wall.

* * * * *